United States Patent [19]
Christopher et al.

[11] Patent Number: 6,058,013
[45] Date of Patent: May 2, 2000

[54] MOLDED HOUSING WITH INTEGRAL HEATSINK

[75] Inventors: Gary L. Christopher, Fox River Grove; William R. Rochowicz, Park Ridge, both of Ill.

[73] Assignee: Motorola Inc., Schaumburg, Ill.

[21] Appl. No.: 09/109,671

[22] Filed: Jul. 2, 1998

[51] Int. Cl.[7] ..................................... H05K 7/20
[52] U.S. Cl. .......................... 361/704; 361/688; 361/705; 361/707; 361/719; 361/728; 361/753; 257/707; 257/713; 165/185; 165/80.3; 174/16.3; 174/52.4
[58] Field of Search ..................... 361/704–707, 361/713, 715–722, 749, 761, 764, 688, 702, 703, 728, 753, 740; 257/706–727; 174/16.3, 252, 161, 163, 52.2–52.4; 439/620, 76.2; 165/80.2, 80.3, 185, 165; 336/61; 29/602.1, 841, 854, 592.1, 832

[56] References Cited

U.S. PATENT DOCUMENTS

| | | | |
|---|---|---|---|
| 4,466,483 | 8/1984 | Whitfield et al. | 165/185 |
| 4,682,270 | 7/1987 | Whitehead et al. | 361/401 |
| 5,218,215 | 6/1993 | Liang et al. | 257/712 |
| 5,302,467 | 4/1994 | Baumgartner et al. | 428/626 |
| 5,708,566 | 1/1998 | Hunninghaus et al. | 361/764 |
| 5,812,375 | 9/1998 | Casperson | 361/707 |

*Primary Examiner*—Leo P. Picard
*Assistant Examiner*—Michael Datskovsky
*Attorney, Agent, or Firm*—Gary J. Cunningham

[57] ABSTRACT

A plastic housing assembly is constructed with a non-plateable plastic wall portion (101), and a plateable plastic wall portion (107) positioned abutting (109) the non-plateable plastic wall portion (101). The plateable plastic wall portion (107) has a via (115) disposed therethrough for thermally coupling an outer surface (111) to an inner surface (113). A heat-generating component (119) is disposed coupled to the second inner surface (113). The via (115) is preferably plated with metal so that heat produced from the heat-generating component (119) is conducted away from the inner surface (113) to the outer surface (111).

29 Claims, 2 Drawing Sheets

MOLDED HOUSING WITH INTEGRAL HEATSINK

FIELD OF THE INVENTION

The present invention relates generally to the field of housings for electronic control modules, and in particular to heat-sinking structures of those housings.

BACKGROUND OF THE INVENTION

Modern electronic control modules products are typically constructed using circuit components mounted to a substrate, often a printed circuit board. Some of these control modules are constructed using molded printed circuit boards. Molded printed circuit boards can be fabricated using what is commonly referred to as two-color plastic. In this type of structure the two plastics are sequentially molded into an appropriate shape to hold the circuit components. One of the two plastic materials can be plated with metal that, once soldered, acts to physically captivate and electrically connect the circuit components.

An attribute of the two-color plastic process is that it can be used to construct housings for enclosing the substrate described above. In fact, the substrate and the housing can be fabricated as one physical part, rather than two separate components. This type of structure is often referred to as a Molded Interconnect Device (MID).

An important performance requirement of control modules is to deliver significant amounts of energy. While delivering this energy heat is generated by certain of those circuit components, typically power transistors, as a byproduct of the inefficiency of those circuit components. Heat can significantly shorten the life of all of the circuit components of the control module and so a mechanism for conducting the heat away from those circuit components is required. Plastic is not an efficient conductor of heat.

Conventional approaches for conducting heat include heat-sink structures that are tightly thermally-coupled to the power transistors (and other heat generating components). These heat-sinks are positioned physically to isolate the generated heat from the non-heat-generating circuit components, and also to efficiently remove heat from the heat-generating components. Typically, heat-sinks are constructed of a metal material.

Manufacturing electronic control modules with metal heat-sinks is bothersome. For one, a separate component needs to be assembled to the control module. Managing the manufacture of the metal heat-sink, and guarantying an efficient thermal coupling during the life of the control module between the heat-generating circuit components and the metal heat-sink, is difficult at best.

Moreover, metal heat-sinks add undesirable mass to the control module, which in adverse vibration and shock environments such as in an automotive application, can significantly shorten the useful life of the control module because of physical failure of the coupling between the heat-generating circuit components and the metal heat-sink.

Additionally, for metal heat-sinks to be thermally efficient they are typically mounted between the heat-generating circuit components and an outside surface of the control module. This arrangement is difficult to seal against external contaminants—such as those found in an automotive environment.

Electrical isolation between various heat-generating circuit components is also important in many applications. Conventionally, either separate heat-sinks, or electrical isolation devices are use to effect this electrical isolation. Electrical isolation devices add to the thermal inefficiency of the structure.

What is needed is a simple, minimum component, with thermally efficient electrical isolation, and which offers an environmentally robust and reliable heat-sinking solution for control module packaging.

DETAILED DESCRIPTION OF THE PREFERRED EMBODIMENT

A plastic housing assembly is constructed with a non-plateable plastic wall portion, and a plateable plastic wall portion positioned abutting the non-plateable plastic wall portion. The plateable plastic wall portion has a via disposed therethrough commencing at an outer surface and extending to an inner surface. A heat-generating component is coupled to the inner surface. The via, the inner surface of the plateable plastic wall portion, and the outer surface of the plateable plastic wall portion, are preferably plated with metal so that heat produced by the heat-generating component is conducted away from the inner surface plateable plastic wall portion to the outer surface of the plateable plastic wall portion. The invention can be better understood with reference to the drawings.

Figure 1:
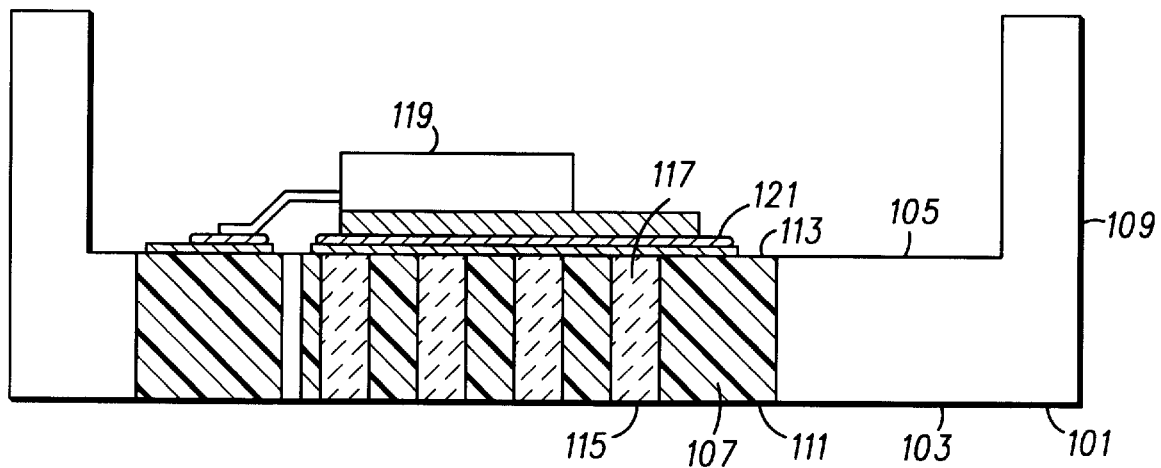
FIG. 1 is a cross-sectional view of a molded housing with an integral heat-sink, in accordance with a first embodiment of the invention.

FIG. 1 is a cross-sectional view of a molded housing with an integral heat-sink, in accordance with a first embodiment of the invention. Essentially, this embodiment offers a thermally efficient and reliable heat-sinking solution for control module packaging by intermixing a plateable and non-plateable plastic in a housing configuration.

In FIG. 1, a first plastic wall portion 101 commences at a first outer surface 103, and extends to a first inner surface 105 oriented opposing the first outer surface 103. Both the first outer surface 103, and the first inner surface 105 are non-plateable. This non-plateable material can be made from many different plastics. Typically a thermoset material is used but other materials such as thermoplastic-type materials may also be used.

A second plastic wall portion 107 is positioned abutting 109 the first plastic wall portion 101. In practice, the first plastic wall portion 101 is injected into a mold first and soon thereafter the second plastic wall portion 107 is progressively injected or vice-versa. The second plastic wall portion 107 commences at a second outer surface 111 positioned proximal the first outer surface 103 of the first plastic wall portion 101, and extends to a second inner surface 113 positioned proximal the first inner surface 105 of the first plastic wall portion 101. Both the second outer surface 111 and the second inner surface 113 of the second plastic wall portion 107 are plateable. The second plastic wall portion 107 is typically made using a thermoset material, although a thermoplastic material may be used.

The mold used to hold the injected plastics includes a feature that creates a via 115 through the second plastic wall portion 107. This via 115 extends between the second outer surface 111 and the second inner surface 113. In a post injection process the via 115, second outer surface 111, and the second inner surface 113 are plated. Typically, this thermally-conductive material 117 is copper, but may be any other thermally conductive, and/or electrically conductive material.

A heat-generating component 119 is disposed coupled to the second inner surface 113. As shown in FIG. 1, the via 115 can be arranged in an array which more effectively conducts heat away from the heat-generating component 119. In a typical application the heat-generating component 119 is a power transistor, and the power transistor is coupled to the thermally-conductive material 117 of the second inner surface 113, with a solder connection 121.

Next, a second embodiment will be described including multiple heat-generating components that require electrical isolation.

Figure 2:
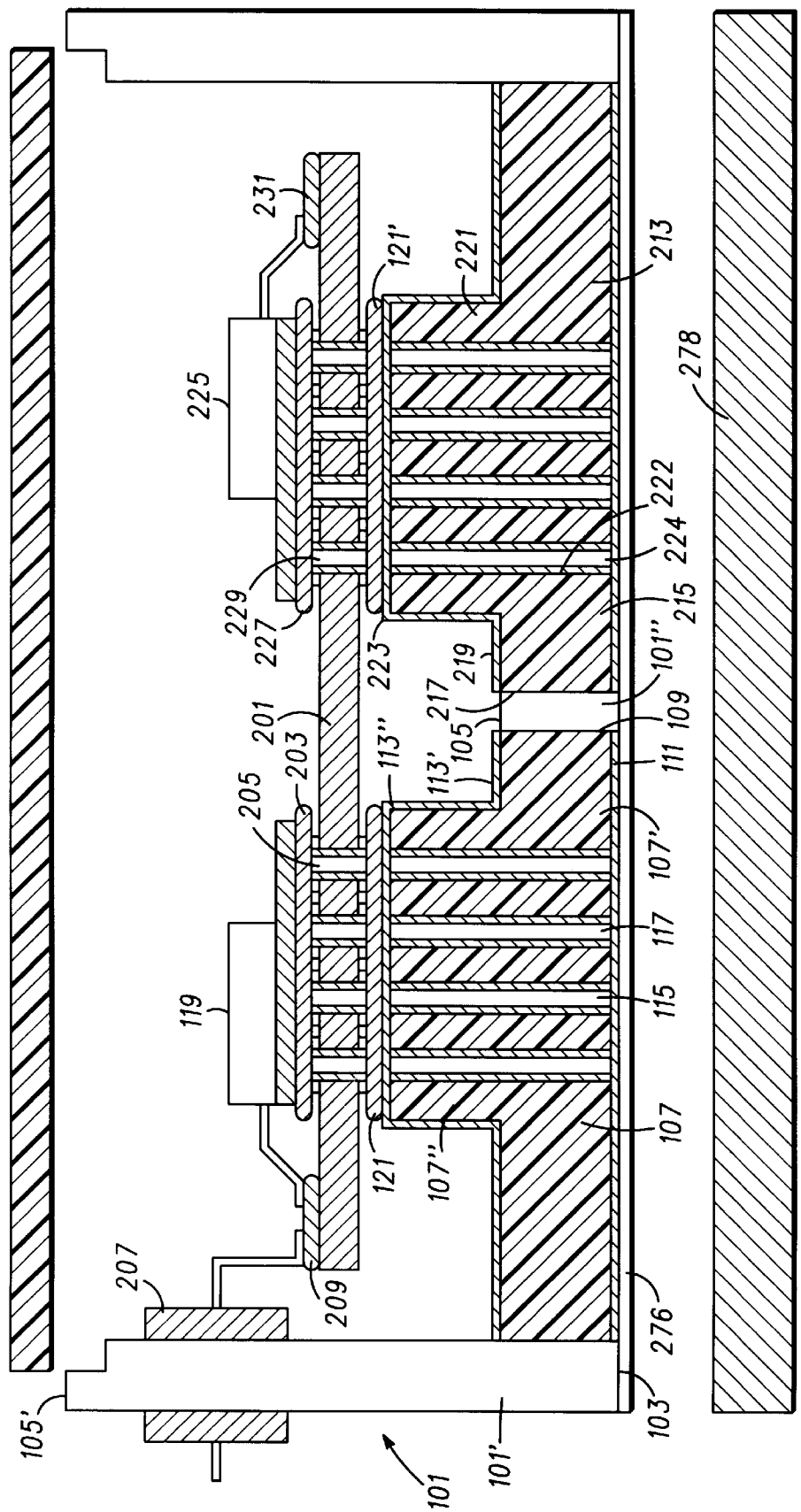
FIG. 2 is a cross-sectional view of a molded housing with an integral heat-sink, in accordance with a second embodiment of the invention.

FIG. 2 is a cross-sectional view of a molded housing with an integral heat-sink, in accordance with a second embodiment of the invention.

In this embodiment a plastic housing assembly is constructed using the first plastic wall portion 101 with a first section 101" commencing at the first outer surface 103, and extending to the first inner surface 105 oriented opposing the first outer surface 103 as in the first embodiment. The first plastic wall portion 101 also has a second section 101' commencing at the first outer surface 103, and extending to a third inner surface 105' oriented opposing the first outer surface 103 and apart from the first inner surface 105. Here the first outer surface 103, the first inner surface 105, and the third inner surface 105' are all non-plateable.

The second plastic wall portion 107 has a first section 107' positioned abutting 109 the first section 101" of the first plastic wall portion 101. The first section 107' of the second plastic wall portion 107 commences at a second outer surface 111, positioned proximal the first outer surface 103 of the first section 101" of the first plastic wall portion 101, and extends to a second inner surface 113' positioned proximal the first inner surface 105 of the first section 101' of the first plastic wall portion 101. The second plastic wall portion 107 has a pedestal section 107" which extends above the first section 107' of the second plastic wall portion 107. The pedestal section 107" commences at the second outer surface 111 and extends to a pedestal surface 113" opposing the second outer surface 111 and positioned apart from or above the second inner surface 113'. The pedestal surface 113" is plateable.

In FIG. 2, the via 115 is disposed through the pedestal section 107" of the second plastic wall portion 107, extends between the second outer surface 111 and the pedestal surface 113", the via 115 includes a thermally-conductive material 117 disposed thereon. Both second outer surface 111 and the pedestal surface 113" also have the thermally-conductive material 117 disposed thereon so that there is a continuous low resistance thermal path between the second outer surface 111 and the pedestal surface 113".

Next, as in the first embodiment, a heat-generating component 119 is disposed coupled to the pedestal surface 113" using solder or other suitable material.

Another portion of the structure consists of a third plastic wall portion 213 having a first section 215 positioned abutting 217 the first section 101" of the first plastic wall portion 101. The first section 215 of the third plastic wall portion 213 commences at the second outer surface 111 positioned proximal the first outer surface 103 of the first section 101" of the first plastic wall portion 101, and extends to a third inner surface 219 positioned proximal the first inner surface 105 of the first section 101" of the first plastic wall portion 101. The third plastic wall portion 213 has a pedestal section 221 extending above the first section 215 of the third plastic wall portion 213. The pedestal section 221 commences at the second outer surface 111 and extends to a pedestal surface 223 opposing the second outer surface 111 and positioned apart from the third inner surface 219. The pedestal surface 223 is also plateable. Another via, or array of vias 224, is disposed through the pedestal section 221 of the third plastic wall portion 213 and extends between the second outer surface 111 and the pedestal surface 223. The another via 224 has thermally-conductive material 222 disposed thereon extending coupling the second outer surface 111 and the another pedestal surface 223 .

Next, another heat-generating component 225 is disposed coupled to the pedestal surface 223. Here, the heat-generating component 225 is power transistor and is coupled to the another thermally-conductive material 222 of the pedestal surface 223, with another solder connection 121'.

The first section 101" of the first plastic wall portion 101 acts to electrically isolate the heat-generating components 119 and 225.

Alternatively, in this second embodiment, the heat-generating components 119 and 225 are coupled to their respective pedestal surfaces 113" and 223 via a substrate 201. The substrate 201 is coupled to the thermally-conductive material 117 of the pedestal surface 113" with a first solder connection 121 and the heat-generating component 119 is coupled to the substrate 201 with a second solder connection 203. A metalized via 205 thermally connects the first solder connection 121 and the second solder connection 203. In this configuration the substrate 201 is coupled to the thermally-conductive material 222 of the pedestal surface 223 with a third solder connection 121' and the power transistor 225 is coupled to the substrate 201 with a fourth solder connection 227. The substrate 201 has another metalized via 229 disposed therethrough thermally connecting the third solder connection 121' and the fourth solder connection 227.

The plastic housing assembly can also include an electrical connector portion 207 positioned extending through the first plastic wall portion 101 for electrically connecting 209 the heat-generating component 119 to the electrical connector portion 207, and the another heat-generating component 225 is electrically connected 231 to the electrical connector portion 207.

Furthermore, an electrically insulating material 276 can be disposed in contact with the first outer surface 103, and the second outer surface 111 to form an electrical isolation barrier. Preferably, the electrically insulating material 276 is an adhesive material. Additionally, a metal plate 278 can be disposed in contact with the electrically insulating material 276. This is done to effect more rapid heat spreading and adding thermal mass to absorb thermal transients thus minimizing temperature rise of the heat generating component 119. The electrically insulating material 276 is used to isolate different electrical potentials of the circuits associated with the components 119 and 225.

Alternatively, if electrical isolation is not required, the metal plate 278 can be placed in contact with the second outer surface 111, if all of the outer surfaces 111 are at the same electrical potential. The metal plate 278 provides more rapid heat spreading and adds thermal mass to absorb thermal transients thus minimizing temperature rise of the heat generating component 119.

Note also that the vias 115 and 224 may comprise an array of individual vias for better thermal conductivity performance.

The described structure offers a simple, minimum component, with thermally efficient electrical isolation, and which offers an environmentally robust and reliable heat-sinking solution for control module packaging.

What is claimed is:

1. A molded housing for use with an electronic component, the housing comprising:
   a first portion having a bottom surface and a top surface, the first portion being formed of a non-plateable plastic material;
   a second portion abutting the first portion along an interface, the second portion having a bottom surface disposed generally coplanar with the first portion bottom surface, the second portion further having a top surface, the second portion being formed of a plateable plastic material;
   a metallized via formed in the second portion and extending between the second portion bottom surface and the second portion top surface;
   a conductive metallic layer deposited on the second portion top surface, the metallic layer being in conductive heat transfer relationship with the metallized via, an area of the metallic layer being adapted to receive thereon the electronic component, the metallic layer and the via cooperating to define a thermal pathway between the second portion top surface and the second portion bottom surface.

2. The molded housing of claim 1, wherein the second portion top surface is disposed generally coplanar with the first portion top surface.

3. The molded housing of claim 1, wherein the second portion includes a first section and a second section, the first and second sections being separated by an intervening section of the first portion.

4. The molded housing of claim 3, wherein each of the second portion first and second sections has a metallic layer deposited thereon, the second portion first section being electrically and thermally isolated from the second portion second section by the first portion intervening section.

5. The molded housing of claim 4, wherein each of the second portion first and second sections is adapted to receive thereon an electronic component.

6. The molded housing of claim 1, wherein the second portion includes a pedestal, the pedestal having a top surface spaced away from the second portion top surface, a portion of the metallic layer being deposited on the pedestal top surface, and wherein the via extends to the pedestal top surface, the pedestal top surface being adapted to receive thereon the electronic component.

7. The molded housing of claim 3, the housing being adapted for use with a second electronic component, and wherein each of the first and second sections includes a pedestal, each pedestal having a top surface spaced away from the second portion top surface and having a portion of the metallic layer deposited thereon, the top surface of the first section pedestal being adapted to receive the first mentioned electronic component, the top surface of the second section pedestal being adapted to receive the second mentioned electronic component, the first and second electronic components being electrically and thermally isolated by the intervening portion, and further including a metallized via formed in each of the first and second pedestals and extending to the top surface of the first and second pedestals.

8. The molded housing of claim 1, wherein the metallized via includes an array of metallized vias.

9. The molded housing of claim 1, in combination with an IC die, the IC die being attached to the metallic layer by a solder connection.

10. The molded housing of claim 1, including a plurality of metallized vias, each of the metallized vias being thermally interconnected by the metallic layer.

11. The molded housing of claim 1, including a second metallic layer deposited on the second portion bottom surface, the second metallic layer being in conductive heat transfer relationship with the metallized via.

12. The molded housing of claim 7, including a substrate adapted to receive the first and second electronic components, and further wherein the first and second pedestals sized to support corresponding first and second portions of the substrate, each of the substrate first and second portions including a metallized via in heat transfer relationship with its corresponding pedestal top surface.

13. The molded housing of claim 12, wherein each substrate metallized via is secured to its corresponding pedestal top surface by a solder connection.

14. The molded housing of claim 1, including a metal plate disposed adjacent the first portion bottom surface and the second portion bottom surface, the metal plate being secured to the bottom surfaces by a thermally conductive adhesive.

15. The molded housing of claim 6, including a substrate adapted to receive the electronic component, the substrate being secured to the pedestal top surface by a first solder connection and the electronic component being secured to the substrate by a second solder connection, the substrate including a metallized via for thermally coupling the first solder connection and the second solder connection.

16. The molded housing of claim 1, wherein the second portion includes an area adapted to receive an electrical connector.

17. A device for use with an electronic component, the device comprising:
   a housing, the housing including a first portion constructed of a non-plateable plastic material, and a second portion constructed of a plateable plastic material, the first and second portions being integrally molded and being separated from each other along an interface, an outer surface of the first portion being generally contiguous with an outer surface of the second portion, the second portion including an inner surface adapted to receive thereon the electronic component;
   a metallized via formed in the second portion and extending between the second portion outer surface and the second portion inner surface;
   a conductive metallic layer deposited on the second portion inner surface and being in heat transfer relationship with the metallized via;
   thereby defining a thermal pathway between the metallic layer and the metallized via, thereby permitting heat to be conducted away from an electronic component secured to the second portion inner surface.

18. The device of claim 17, wherein the first portion includes an inner surface and the second portion includes an inner surface, at least a section of the second portion inner surface being generally coplanar with the first portion inner surface, and wherein the metallic layer electrically and thermally isolates the first portion inner surface from the second portion inner surface.

19. The device of claim 17, wherein the second portion includes a first section and a second section, the first and second sections being separated by an intervening section of the first portion.

20. The device of claim 19, wherein each of the second portion first and second sections has a metallic layer deposited thereon, the second portion first section being electrically and thermally isolated from the second portion second section by the first portion intervening section.

21. The device of claim 20, wherein each of the second portion first and second sections is adapted to receive thereon an electronic component.

22. The device of claim 19, wherein the second portion includes an inner surface and further includes a pedestal, the pedestal having a top surface spaced away from the second portion inner surface, a portion of the metallic layer being deposited on the pedestal top surface, and further wherein the via extends to the pedestal top surface, the pedestal top surface being adapted to receive thereon the electronic component.

23. The device of claim 22, the housing second portion being adapted to receive a second electronic component, and wherein each of the first and second sections includes a pedestal, each pedestal having a top surface spaced away from the second portion inner surface and having a portion of the metallic layer deposited thereon, the top surface of the first section pedestal being adapted to receive the first mentioned electronic component, the top surface of the second section pedestal being adapted to receive the second mentioned electronic component, the first and second electronic components being electrically and thermally isolated by the intervening portion, and further including a metallized via formed in each of the first and second pedestals and extending to the top surface of the first and second pedestals.

24. The device of claim 17, wherein the metallized via includes an array of metallized vias.

25. The device of claim 17, including a second metallic layer deposited on the second portion outer surface, the second metallic layer being in conductive heat transfer relationship with the metallized via.

26. The device of claim 23, including a substrate adapted to receive the first and second electronic components, and further wherein the first and second pedestals are sized to support corresponding first and second portions of the substrate, each of the substrate first and second portions including a metallized via in heat transfer relationship with its corresponding pedestal top surface.

27. The device of claim 17, including a metal plate disposed adjacent the first portion outer surface and the second portion outer surface, the metal plate being secured to the outer surfaces by a thermally conductive adhesive.

28. A molded housing for an electronic control module, comprising:

a first portion formed of a non-plateable plastic material and having an outer surface and an inner surface;

a second portion formed of a plateable plastic material and being integrally formed with the first portion and being separated from the first portion by an interface, the second portion having an outer surface disposed generally coplanar with the first portion outer surface, the second portion further having an inner surface, the second portion including a pedestal having a top surface spaced away from the second portion inner surface;

a via formed in the second portion and extending between the second portion outer surface and the pedestal top surface;

a conductive metallic layer deposited on the second portion inner surface, the pedestal top surface, and extending through the via; and an electronic component secured to a portion of the metallic layer on the pedestal top surface by a solder connection, the solder connection being in heat transfer relationship with the metallic layer;

the solder connection, the metallic layer and the via cooperating to define a thermal pathway between the electronic component and the second portion outer surface.

29. The control module of claim 28, wherein the second portion includes a first section and a second section, the first and second sections being separated by an intervening portion of the first portion, each of the first and second sections including a pedestal having a top surface spaced away from the second portion inner surface and having a portion of the metallic layer deposited thereon, each of the pedestals having a via extending to the top surface thereof, and an electronic component secured by a solder connection to the top surface of the second section pedestal, the first and second electronic components being electrically and thermally isolated from each other by the intervening portion.

* * * * *